(12) United States Patent
Hutter, III

(10) Patent No.: US 7,413,790 B2
(45) Date of Patent: Aug. 19, 2008

(54) ADHESIVE ATTACHMENT WITH ELECTRICAL GROUND

(75) Inventor: Charles G. Hutter, III, Carson City, NV (US)

(73) Assignee: Physical Systems, Inc., Carson City, NV (US)

( * ) Notice: Subject to any disclaimer, the term of this patent is extended or adjusted under 35 U.S.C. 154(b) by 324 days.

(21) Appl. No.: 11/149,120

(22) Filed: Jun. 8, 2005

(65) Prior Publication Data
US 2005/0280032 A1   Dec. 22, 2005

Related U.S. Application Data

(60) Provisional application No. 60/581,936, filed on Jun. 21, 2004.

(51) Int. Cl.
H01R 4/66 (2006.01)

(52) U.S. Cl. .......... 428/139; 428/99; 428/922; 428/343; 439/108; 439/103; 174/5 SG; 174/5 R; 29/857; 29/854

(58) Field of Classification Search .......... 439/108, 439/103; 174/5 SG, 5 R; 428/139, 922, 428/343, 99; 29/857, 854
See application file for complete search history.

(56) References Cited

U.S. PATENT DOCUMENTS

| | | | |
|---|---|---|---|
| 3,308,415 A * | 3/1967 | Cramer et al | 439/103 |
| 3,733,576 A * | 5/1973 | Cooper | 439/103 |
| 4,302,492 A | 11/1981 | Hutter, III | |
| 4,338,151 A | 7/1982 | Hutter, III | |
| 4,390,576 A | 6/1983 | Hutter, III | |
| 4,541,684 A * | 9/1985 | Holman et al. | 439/108 |
| 4,668,546 A | 5/1987 | Hutter, III | |
| 4,778,702 A * | 10/1988 | Hutter, III | 428/40.9 |
| 4,822,656 A | 4/1989 | Hutter, III | |
| 4,842,912 A | 6/1989 | Hutter, III | |
| 5,013,391 A | 5/1991 | Hutter, III et al. | |
| 5,603,472 A | 2/1997 | Hutter, III | |
| 5,704,747 A | 1/1998 | Hutter, III et al. | |
| 6,727,466 B2 | 4/2004 | Hutter, III | |
| 6,773,780 B2 | 8/2004 | Hutter, III | |

* cited by examiner

*Primary Examiner*—William P Watkins, III
(74) *Attorney, Agent, or Firm*—Kelly Lowry & Kelley, LLP; Stuart O. Lowry

(57) ABSTRACT

An adhesive attachment is provided for securely mounting an attachment component such as a threaded stud or the like on the surface of a selected substrate, wherein the adhesive attachment provides an electrically conductive ground path for grounding the attachment component and/or a selected structure mounted thereto to the substrate. In one preferred form, the attachment component is a threaded element such as a stud or nut. Upon mounting of the attachment component on the substrate and subsequent connection of the threaded element to a mating threaded member, e.g., of the selected structure to be mounted onto the attachment component, a conductive ground pin is pressed into electrical contact with the substrate for grounding the attachment component and/or the selected structure mounted thereto.

21 Claims, 7 Drawing Sheets

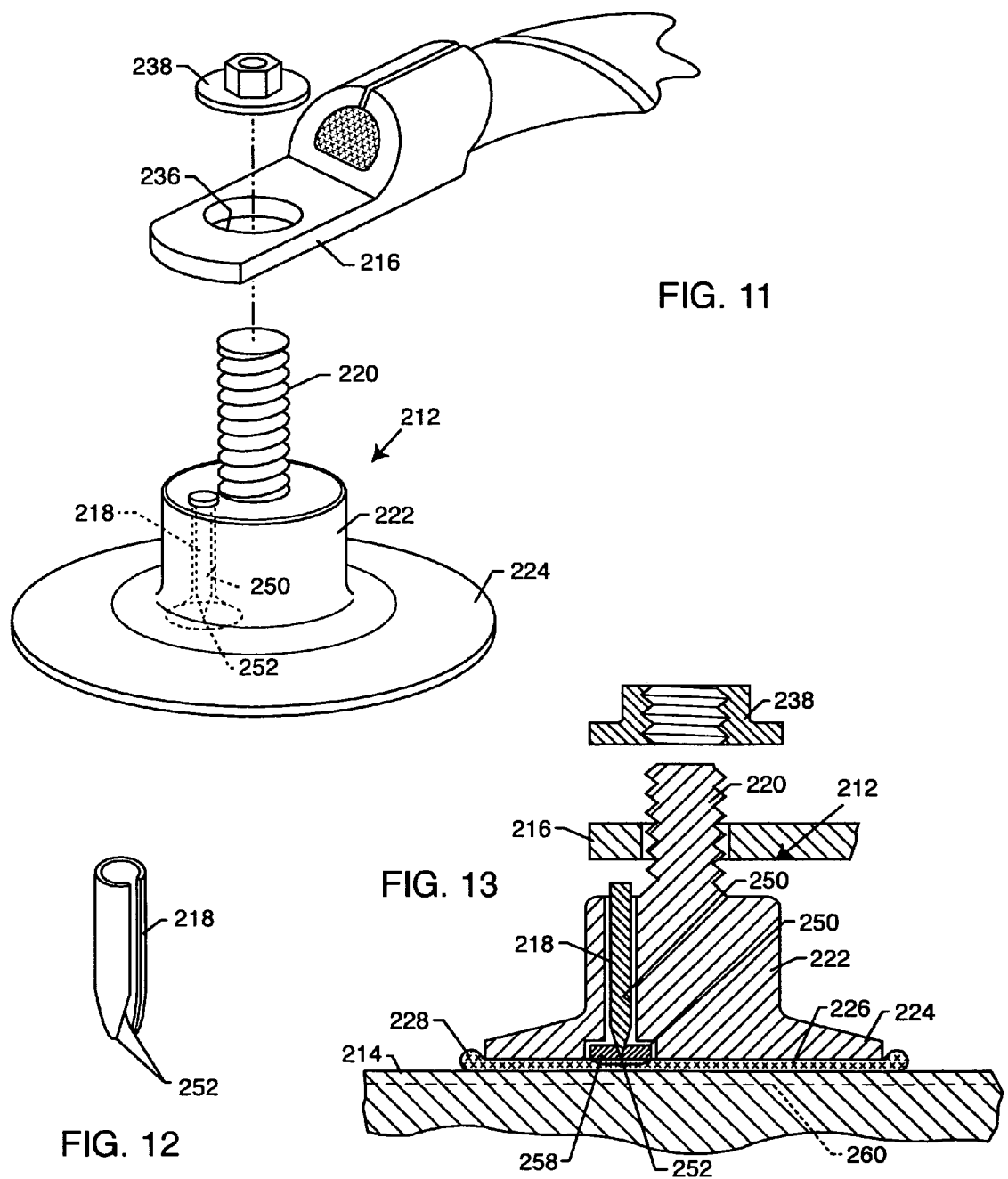

ADHESIVE ATTACHMENT WITH ELECTRICAL GROUND

This application claims the benefit of U.S. Provisional Application 60/581,936, filed Jun. 21, 2004.

BACKGROUND OF THE INVENTION

This invention relates generally to adhesive attachment assemblies or fixtures and related methods for securing an attachment component or the like to a supporting surface or substrate. More specifically, this invention relates to improvements in such adhesive attachment assemblies or fixtures, of the general type shown and described in U.S. Pat. Nos. 4,302, 492; 4,338,151; 4,390,576; 4,668,546; 4,778,702; 4,822,656; 4,842,912; 5,013,391; 5,704,747; 5,603,472; 6,727,466; and 6,773,780, and particularly with respect to providing a substrate ground path for electrically grounding the attachment component and/or a selected structure mounted thereto.

In many instances, it is necessary or desirable to mount an attachment component or element such as a patch, threaded screw, or other structure onto a supporting substrate. For example, it may necessary to apply a thin patch to the skin of an aircraft or to the hull of a boat to repair a hole therein. Alternately, it may be desirable to mount a threaded element, such as a threaded stud or nut, or other device onto a substrate without requiring a hole to be made in the substrate, and wherein the threaded element or the like is adapted for subsequent mounting of a selected structure such as a cable tie for supporting one or more conductive cables, or an electrical junction box, or the like. In many such cases, it is necessary for the attachment component to be located on the substrate with relatively high precision and further that a positive force be applied for urging or pressing the attachment component against the substrate for at least some minimum time period to allow, for example, curing of an adhesive bonding agent such as a curable epoxy or the like to achieve a substantially optimized and secure bond with the substrate.

Exemplary adhesive attachment assemblies and related attachment fixtures designed for quick and easy mounting of an attachment component on a substrate, while achieving a high bond strength, are shown and described in U.S. Pat. Nos. 4,302,492; 4,338,151; 4,390,576; 4,668,546; 4,778,702; 4,822,656; 4,842,912; 5,013,391; 5,704,747; 5,603,472; 6,727,466; and 6,773,780, all of which are incorporated by reference herein. In such products, an attachment component is adhesively mounted directly onto the substrate, or otherwise carried by a support fixture that is adhesively mounted onto the substrate. In each configuration, the attachment component or the associated support fixture is inherently spaced from the surface of the substrate by a relatively thin film of adhesive bonding agent, wherein this bonding agent typically exhibits relatively nonconductive or dielectric properties. In other words, the adhesive bonding agent effectively insulates the attachment component or support fixture from electrical communication with the substrate.

In some applications, it is necessary or desirable to mount the attachment component and/or the associated support fixture in electrical conductive contact with the substrate. For example, some structures such as an electrical junction box or the like adapted for mounting onto the attachment component are designed to be electrically connected to a suitable ground point, such as by connection to the substrate which may be formed from or otherwise incorporate a conductive material. However, as noted above, the adhesive bonding agent effectively insulates the attachment component or related support fixture from the substrate. Accordingly, in the past when a grounded connection has been required, a metal attachment component has typically been welded to the substrate in lieu of using an adhesive bonded interface. Such welded attachments inherently require specialized equipment and trained personnel, and further require that the attachment component and substrate be constructed from weld-compatible metal materials. For some materials such as aluminum and composites of the type used widely in the aerospace industry, welding steps cannot be employed.

One potential solution to this problem comprises the use of an electrically conductive adhesive bonding agent formed by loading an otherwise substantially dielectric adhesive bonding agent with conductive particles, so that the attachment component and/or related support fixture can be adhesively mounted in electrically conductive relation to the substrate. However, conductive particle inclusions adversely and undesirably weaken the bond strength of the adhesive material. In addition, the current-carrying capacity of the conductive particle inclusions is insufficient for many applications, and further exhibits a tendency to deteriorate over time.

There exists, therefore, a significant need for improvements in and to adhesive attachment assemblies for adhesively mounting an attachment component or related support fixture onto a substrate, wherein the attachment component and/or support fixture and/or a selected structure mounted subsequently mounted thereto is electrically grounded to the substrate in a safe and effective manner. The present invention fulfills these needs and provides further related advantages.

SUMMARY OF THE INVENTION

In accordance with the invention, an improved adhesive attachment or attachment assembly is provided for securely mounting and retaining an attachment component such as a threaded stud or nut or the like on the surface of a substrate, wherein the adhesive attachment provides an electrically conductive ground path coupled to the substrate for grounding the attachment component and/or a selected structure mounted thereto.

In one preferred form, the attachment component comprises a threaded element such as a threaded stud or nut adapted for direct adhesive bonding onto the substrate, or alternately carried by a support fixture adapted for direct adhesive bonding onto the substrate. The attachment component is designed for subsequent connection of the threaded element to a mating threaded member, e.g., forming a portion of or otherwise provided for mounting the selected structure onto the attachment component. A conductive ground pin carried by the attachment component or support fixture is pressed into and securely retained in electrical contact with the substrate for positively grounding the attachment component and/or the support fixture and/or the selected structure mounted thereto.

In one form, the conductive ground pin is carried by a conductive collar slidably mounted on the attachment component in a position for pressing one end of the ground pin into conductive contact with the substrate when the selected structure is mounted onto the attachment component. In another form, the conductive ground pin is carried on the attachment component by a slide collar that may be formed from an insulative material, but wherein opposite ends of the ground pin are pressed into conductive contact respectively with the substrate and the selected structure upon mounting of said selected structure onto the attachment component. In yet another form, the conductive ground pin is carried by a support fixture provided for positioning the attachment component relative to the substrate, wherein opposite ends of the ground pin are pressed into conductive contact with respectively with the substrate and the selected structure upon mounting of said selected structure onto the attachment component. The substrate may be formed from a conductive material, or alternately from a substantially dielectric or nonconductive material such as a carbon fiber composite or the like which incorporates a conductive material. In the case of a dielectric substrate incorporating a conductive material such as a metallic mesh embedded therein, the ground pin may be constructed with a pointed end for pressed embedding partially into the substrate in conductive contact with the conductive material therein.

Other features and advantages of the invention will become more apparent from the following detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIG. 11 is an enlarged and exploded perspective view depicting an adhesive attachment component similar to FIGS. 1-5, but wherein the electrical ground pin is carried directly by the attachment component;

FIG. 12 is a perspective view showing the electrical ground pin of FIG. 11;

FIG. 13 is a fragmented and partially exploded sectional view illustrating the adhesive attachment component of FIG. 11 installed onto a substrate, and further depicting thread-on mounting of a nut in grounded contact via the ground pin with the substrate;

DETAILED DESCRIPTION OF THE PREFERRED EMBODIMENTS

Figure 1:
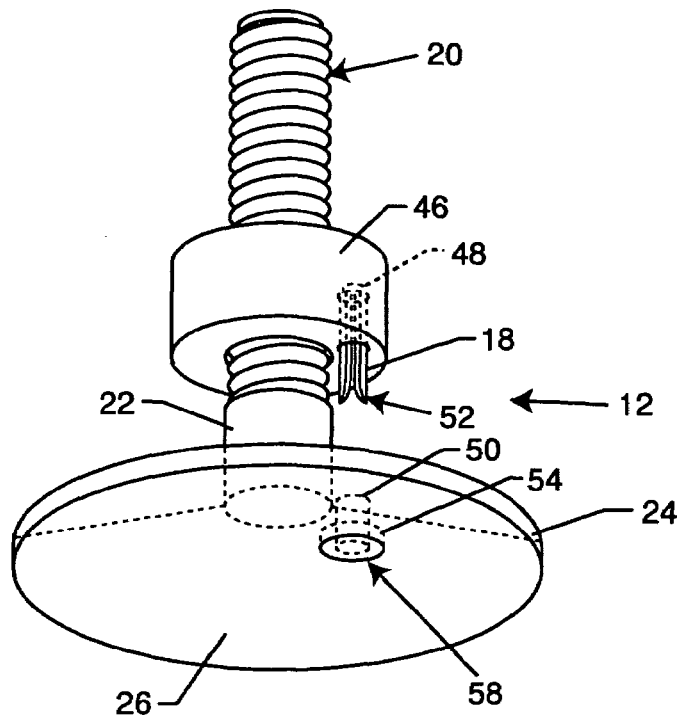
FIG. 1 is a perspective view of an adhesive attachment component in the form of a threaded stud, in combination with an electrical ground pin.
Figure 2:
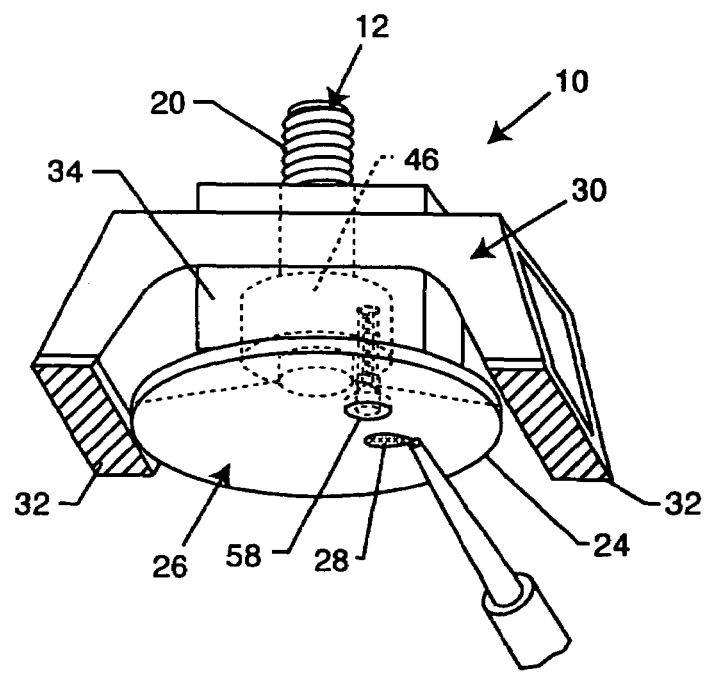
FIG. 2 is a perspective view of the adhesive attachment component shown in FIG. 1 carried by a mounting fixture for use in installing the adhesive attachment onto a substrate.
Figure 3:
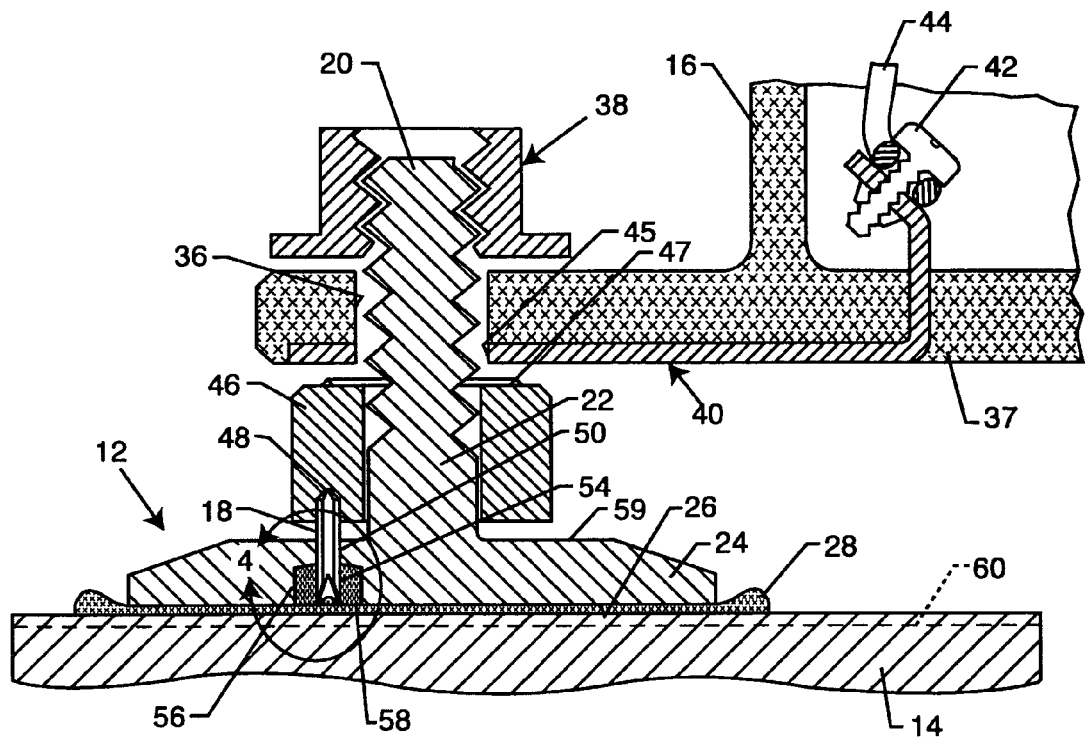
FIG. 3 is an enlarged and partially fragmented sectional view depicting the adhesive attachment component of FIG. 1 installed onto a substrate, and further illustrating relatively loose-fit mounting of a selected structure such as electrical junction box thereon.
Figure 4:
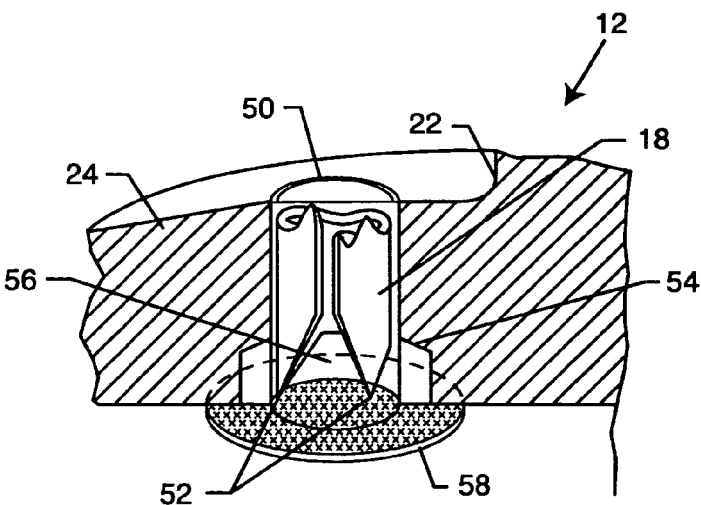
FIG. 4 is a further enlarged and partially fragmented sectional view corresponding generally with the encircled region 4 of FIG. 3.
Figure 5:
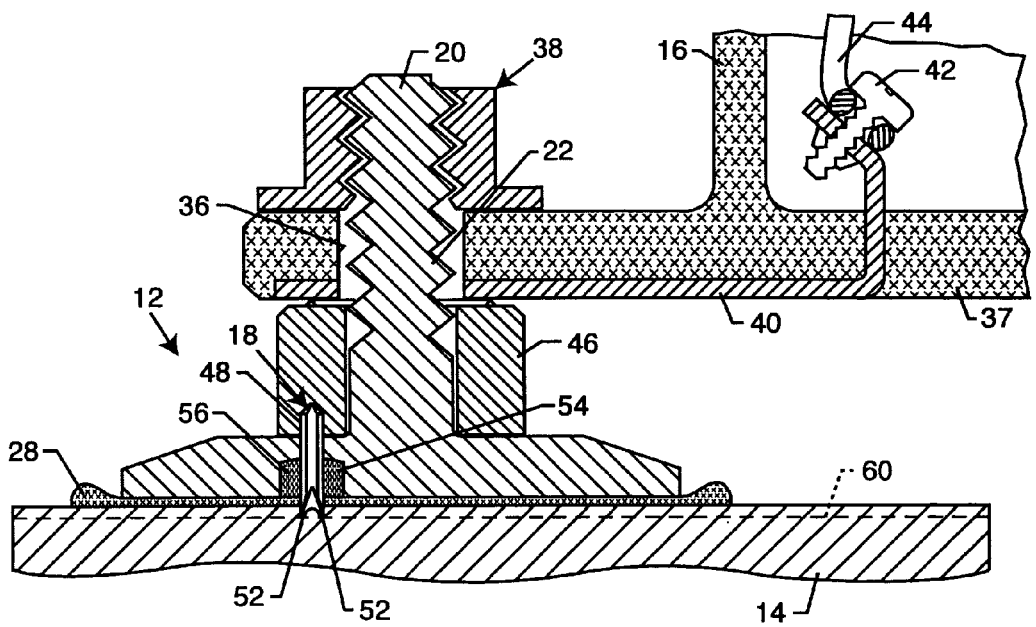
FIG. 5 is an enlarged and partially fragmented sectional view similar to FIG. 3, but showing the selected structure such as an electrical junction box securely fastened onto the adhesive attachment component, and further illustrating the electrical ground pin in electrical contact with the substrate.
Figure 6:
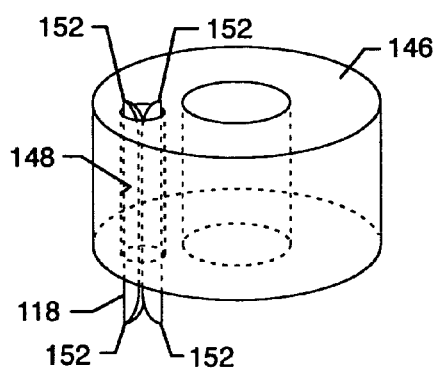
FIG. 6 is an perspective view depicting a slide-fit collar carrying an electrical ground pin in accordance with one alternative preferred form of the invention.

As shown in the exemplary drawings, an adhesive attachment or attachment assembly referred to generally by the reference numeral 10 (FIG. 2) is provided for quick, easy and secure adhesive mounting of an attachment component 12 (FIGS. 1-5) such as a threaded bolt or the like onto the surface of a substrate 14 (FIGS. 3 and 5). The attachment component 12 is adapted for subsequent mounting of a selected structure 16 such as an electrical junction box (FIGS. 3 and 5) or the like onto the substrate 14. A conductive ground pin 18 is carried by the attachment component 12 and is pressed into conductive contact with the substrate 14, when the structure 16 is mounted onto the attachment component 12, for electrically grounding the structure 16 to the substrate 14.

The illustrative attachment component 12 shown in FIGS. 1-5 comprises a threaded stud having an elongated threaded shank 20 joined by a relatively short unthreaded shank shoulder segment 22 with a head or base 24 defining a blind side base surface 26 of relatively large or substantial surface area. This base surface 26 is adapted to receive a selected curable bonding agent 28 (FIGS. 2-3 and 5) for use in securely bonding the base 24 onto the surface of the substrate 14 at a selected position. In this regard, in accordance with a preferred configuration, the attachment component 12 such as the threaded stud depicted in FIGS. 1-5 is pre-assembled with a mounting fixture 30 (FIG. 2) designed for temporary adherence to the substrate by means of one or more films of a suitable pressure sensitive adhesive 32, followed by displacement of a spring element 34 for advancing and retaining the attachment component base 24 with bonding agent 28 thereon pressed firmly with a positive force against the substrate 14 for the duration of a cure cycle for the bonding agent 28. Such mounting fixtures are shown and described in more detail in U.S. Pat. Nos. 4,302,492; 4,338,151; 4,390,576; 4,668,546; 4,778,702; 4,822,656; and 4,842,912, which are incorporated by reference herein.

When the bonding agent 28 has cured, the mounting fixture 30 may be stripped from the substrate 14 leaving the attachment component 12 bonded in place. As viewed in FIG. 3, the attachment component 12 such as the illustrative threaded stud thus facilitates subsequent mounting of a selected structure 16 relative to the substrate 14 without requiring a hole to be formed in the substrate. FIG. 3 shows the structure 16 in the form of an electrical junction box or the like having a bolt port 36 formed in a rear wall 37 thereof for receiving the threaded shank 20, followed by thread-on securement of a suitable nut 38 to retain the junction box 16 on the attachment component 12. Persons skilled in the art will recognize and appreciate that alternative structures 16 may be mounted relative to the substrate 14 by appropriate connection to the attachment component 12, including but not limited to cable tie and/or routing mechanisms and the like. Persons skilled in the art will further understand that the attachment component 12 may take other forms such as a threaded nut for supporting the structure 16 to be mounted thereto by means of threaded bolt or stud.

For some structures 16 to be mounted by the attachment component 12 to the substrate 14, particularly such as the electrical junction box shown in the exemplary drawings, an electrical ground path from the structure 16 to the substrate 14 may be required. In this regard, FIGS. 3 and 5 show the junction box 16 formed from a molded plastic or other substantially nonconductive material incorporating a conductive ground strap 40 having a free end carrying a screw 42 for secure attachment thereto of a ground wire 44 (FIG. 5). The ground strap 40 extends along a rear or blind side of the junction box rear wall 37 and further includes a bolt port 45 therein for receiving the threaded shank 20 of the attachment component 12, when the junction box 16 is mounted thereon.

With this construction, and in accordance with a primary aspect of the present invention, the attachment component 12 provides a conductive ground path coupling the junction box ground strap 40 with the substrate 14. More particularly, a washer-type collar 46 formed from a suitable conductive material is slidably mounted onto the attachment component 12, with a relatively close-tolerance fit about the unthreaded shank segment 22 thereof, and in sandwiched relation between the enlarged base 24 of the attachment component 12 and the overlying conductive ground strap 40 on the junction box rear wall 37. The conductive ground pin 18 such as a rolled steel spring pin or the like has an upper end press-fitted into a downwardly open counterbore 48 formed in an underside surface of the collar 46. A lower end portion of this ground pin 18 protrudes downwardly through an underlying aperture 50 formed in the enlarged base 24 of the attachment component, and terminates in at least one and preferably multiple relatively sharp, downwardly presented prongs 52. These sharp prongs 52 are normally retracted upwardly to a position inset at least slightly into the body of the base 24, i.e., at least slightly above the base surface 26 and the bonding agent 28 thereon. FIGS. 1-4 shows these sharp prongs 52 positioned within a shallow enlarged cavity 54 formed in the underside of the base 24 and filled with a flexible putty or potting compound 56. A paper film patch 58 may also be provided to close this cavity 56 to prevent intrusion of the bonding agent 28 during adhesive mounting of the attachment component 12 onto the substrate 14, as previously described herein.

However, following adhesive mounting of the attachment component 12 onto the substrate 14, the selected structure 16 such as the illustrative junction box is fastened onto the threaded stud by means of the nut 38. Tightening of the nut 38 effectively clamps the rear wall 37 of the junction box together with the conductive strap 40 thereon securely between the nut 38 and the underlying conductive collar 46. An upper face of the collar 46 may include a relative sharp-edged rib 47 for improved conductive contact between the ground strap 40 and the collar. In turn, the collar 46 is clamped tightly against an upper or outboard surface 59 of the enlarged base 24 of the attachment component 12. Importantly, as the collar 46 is tightened against the upper base surface 59, the conductive ground pin 16 is pressed downwardly through the base 24 and the paper patch 58 closing the cavity 54, and further through the now-cured and substantially nonconductive bonding agent 28 into intimate contact with the substrate 14. That is, the sharp prongs 52 at the lower end of the ground pin 16 cut through the patch 58 and the thin film of the now-cured bonding agent 28 to impale or dig in a short distance into the substrate 14, as viewed in FIG. 5.

When the substrate 14 is constructed from a conductive material, such as aluminum or the like, the ground pin 16 thus contacts the substrate 14 to provide an effective and high current-carrying capacity ground path between the ground strap 16 and the substrate 14. This ground path also couples the attachment component 12 and the nut 38 to the substrate, in the event that these components are also made from a conductive material. Alternately, when the substrate 14 is constructed primarily from a substantially nonconductive material such as a carbon fiber-based composite or the like, but otherwise incorporates a conductive mesh 60 embedded therein a short distance below the surface thereof, the sharp prongs 52 of the ground pin 16 impale or dig a sufficient distance into the substrate 14 for contacting the conductive mesh 60.

Accordingly, upon initial adhesive mounting of the attachment component 12 onto the substrate 14, the ground pin 16 is retracted from the substrate 14 and separated from the bonding agent 28 by means of the potting compound 56 and/or the patch 58. Upon subsequent mounting of the selected structure 16 on the substrate 14 by means of the attachment component 12, the step of securely fastening the structure 16 by thread-on advancement of the nut 38 is accompanied by pressed advancement of the ground pin 16 into conductive engagement with the substrate 14 to provide the desired ground path.

FIGS. 6-9 depict one alternative preferred form of the invention, wherein components corresponding in structure and/or function to those previously described are identified by common reference numerals increased by 100. As shown, a modified washer-type collar 146 is provided for slide-fit mounting onto an attachment component 112 such as a threaded stud or the like, wherein a modified washer cavity 148 comprises an axially open passage for receiving and supporting a double-ended conductive ground pin 118 having one or more relatively sharp prongs 152 formed at both ends thereof. In this embodiment of the invention, the prongs 152 at the opposite ends of the ground pin 118 are positioned for conductively contacting the structure 116 (FIG. 8) to be mounted onto the attachment component 112 as well as the substrate 114 (FIG. 8) to provide an effective ground path therebetween. With this arrangement, the collar 146 may be constructed from a nonconductive material.

Figure 7:
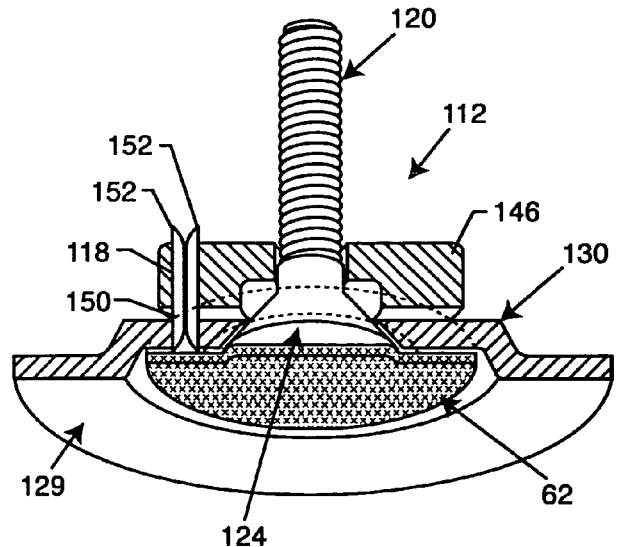
FIG. 7 is a perspective view, shown partially in vertical section, illustrating the slide-fit collar and electrical ground pin of FIG. 6 mounted onto a support fixture which in turn carries an attachment component such as a threaded stud.
Figure 8:
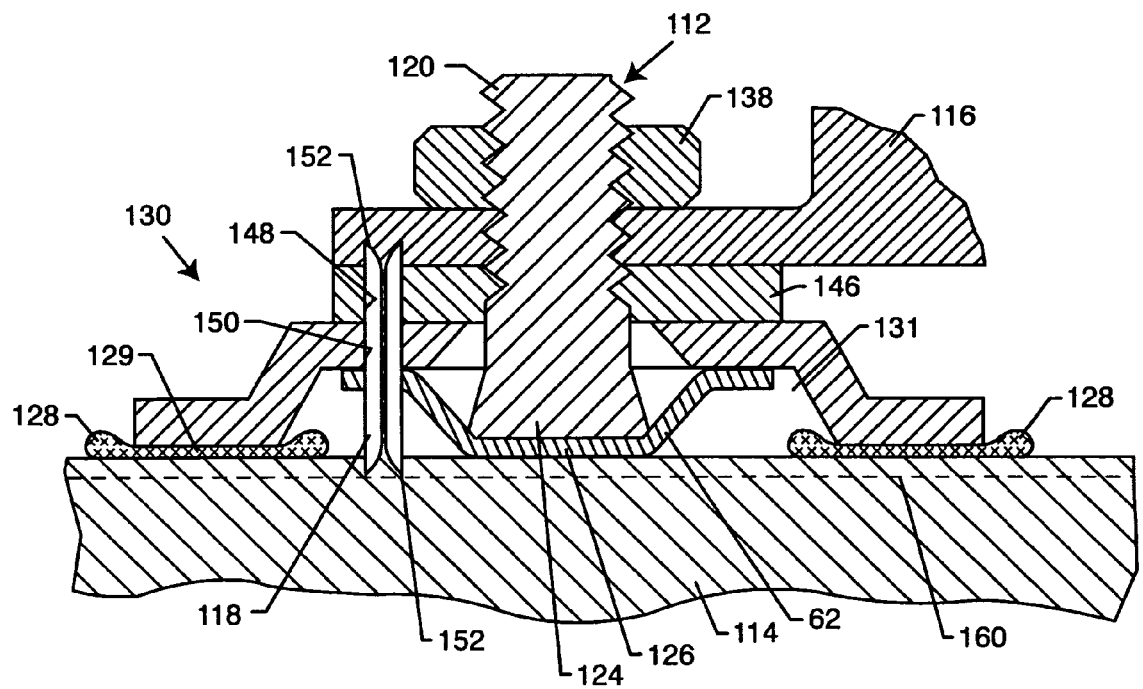
FIG. 8 is an enlarged and partially fragmented sectional view similar to FIG. 5, but depicting the support fixture and attachment component of FIG. 7 installed onto a substrate with the electrical ground pin in electrical contact with the substrate.
Figure 9:
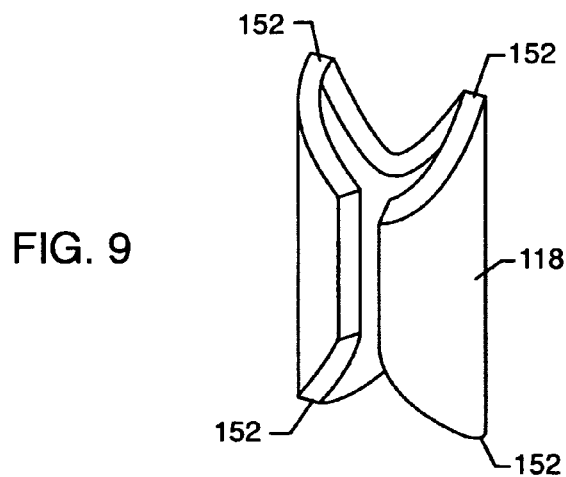
FIG. 9 is an enlarged perspective view showing the electrical ground pin of FIGS. 7-8.

FIGS. 7-8 show the attachment component 112 carried by a support fixture 130 adapted for secure bonded attachment to the substrate 114 by means of a suitable adhesive bonding agent 128 applied to an annular base surface 129 thereof, and for thereafter retaining the attachment component 112 relative to the substrate 114. That is, unlike the mounting fixture 30 shown in FIG. 2 for temporary adherence to the substrate 14 while the attachment component 12 is bonded directed to the substrate, the support fixture 130 is designed for direct bonding to the substrate 114 and for thereafter supporting the attachment component 112 on the substrate typically with a minor degree of freedom of movement. Support fixtures of this general type are shown and described in more detail in U.S. Pat. Nos. 6,727,466 and 6,773,780, which are incorporated by reference herein.

More particularly, the attachment component 112 such as a threaded stud includes a threaded shank 120 joined to an enlarged head or base 124 defining a blind side surface 126. A resilient pressure sensitive adhesive member 62 has a first portion adhered to the blind side 126 of the attachment base 124, a second portion adhered to the support fixture 130, and a third portion for stretched elongation therebetween. In an initial configuration prior to mounting of the support fixture 130 onto the substrate 114, the enlarged head or base 124 of the threaded stud attachment component is positioned within a shallow undercut cavity 131 formed in the underside of the support fixture typically circumscribed by the annular base surface 129 to be adhesively secured to the substrate.

Upon placement of the support fixture 130 with bonding agent 128 thereon against the substrate 114, the attachment component 112 can be pressed against the substrate for temporary adherence thereto by means of the first portion of the adhesive member 62. In this configuration, as viewed in FIG. 8, the intermediate third portion of the adhesive member 62 is stretched and pulls the support fixture 130 against the substrate 114 for the duration of the bonding agent cure cycle. Thereafter, the support fixture 130 remains bonded to the substrate for positioning the attachment component 112 on the substrate, all as shown and described in more detail in the above-referenced U.S. Pat. No. 6,773,780.

The collar 146 is carried by the attachment component 112 and supports the double-ended conductive ground pin 118 such as a rolled steel spring pin or the like having the opposite ends thereof shaped (FIG. 9) to incorporate at least one and preferably multiple prongs 152. The ground pin 118 can be press-fit installed into the collar passage 148, with a lower end of the ground pin 118 extending at least partially into an aperture 150 formed in the support fixture 130 but otherwise retracted from fixture surface 129 with the bonding agent 128 thereon. Following bonded securement of the support fixture 130 onto the substrate 14, the selected structure 116 can be connected to the attachment component 112. FIG. 8 illustrates the structure 116 in the form of a conductive lug, although persons skilled in the art will recognize and appreciate that other structure forms may be used. When the nut 138 is tightened onto the threaded stud 112 as shown, an underside surface of the lug 116 bears intimately against the sharp prongs 152 at the upper end of the ground pin 118, and concurrently presses the sharp prongs 152 at the opposite or lower end of the ground pin into conductive contact with the substrate 114, or a conductive material 160 incorporated therein, thereby providing an effective ground path between the structure 116 and substrate 114.

Figure 10:
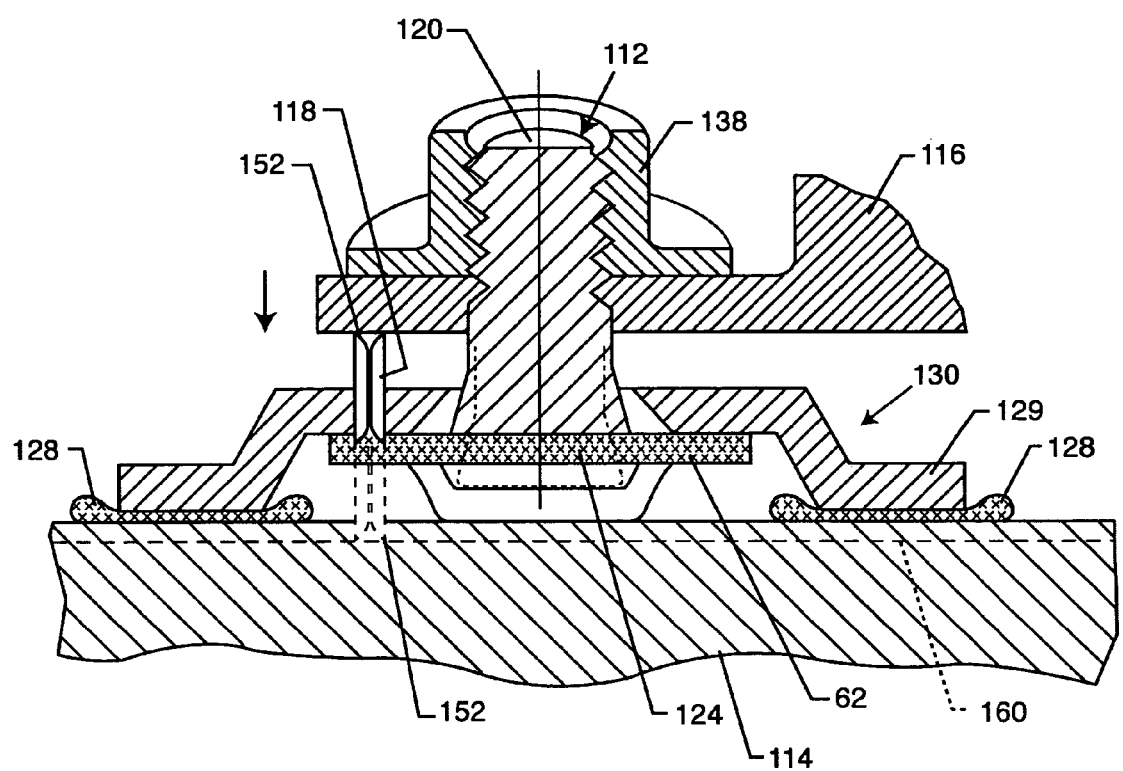
FIG. 10 is an enlarged and partially fragmented perspective view similar to FIG. 8, but showing a further alternative preferred form on the invention wherein an electrical ground pin is carried directly by the support fixture.

A further modified form of the invention is shown in FIG. 10 wherein components corresponding with the embodiment of FIGS. 6-9 are identified by common reference numerals. In this version of the invention, the slide-fit mounted collar 146 (FIGS. 6-9) is omitted and the ground pin 118 is carried directly within the aperture 150 formed in the support fixture 130. Upon adhesive bonded mounting of the support fixture 130 onto the substrate 114, and subsequent mounting of the structure 116 such as a conductive lug onto the attachment component 112 such as a threaded stud, the underside surface of the lug 116 bears intimately against the sharp prongs 152 at the upper end of the ground pin 118, and concurrently presses the sharp prongs 152 at the opposite or lower end of the ground pin into conductive contact with the substrate 114, or a conductive material 160 incorporated therein, thereby providing an effective ground path between the structure 116 and substrate 114.

Another alternative preferred form of the invention is depicted in FIGS. 11-13, wherein components corresponding in structure and/or function to those shown and described in FIGS. 1-5 are identified by common reference numerals increased by 200. As shown, an attachment component 212 carries and supports a conductive ground pin 218 for intimate conductive engagement with the substrate 214 and a selected structure 216 such as a cable terminal mounted onto the attachment component 212.

More particularly, the attachment component 212 shown in FIGS. 11-13 may comprise a threaded stud of the general type shown and described in FIGS. 1-5, to include a radially enlarged unthreaded shoulder segment 222 formed between a threaded shank 220 and an enlarged head or base 224. This attachment component 212 is adapted for adhesive bonded attachment to a substrate 214, as by means of a temporarily adhered fixture of the type previously referenced herein (but not illustrated in FIGS. 11-13). The conductive ground pin 218 such as a rolled steel spring pin or the like is press-fit installed into an axially open passage 250 formed in the radially enlarged shoulder segment, and includes at least one and preferably multiple prongs 252 formed at a lower end thereof. The upper end of the ground pin 218 may be flat as shown, or alternately may include additional sharp prongs, if desired. The sharp prongs 252 at the lower end of the ground pin are initially retracted into a shallow enlarged cavity 254 at the lower end of the passage 250, at a location above the base surface 226 of the attachment component 212. A piercable elastomer plug 258 (FIG. 13) is seated within this cavity 254 to prevent intrusion of bonding agent 228. In this position, an upper end of the conductive ground pin 218 protrudes a short distance above the uppermost plane of the shoulder segment 222, as viewed best in FIG. 13.

Following bonded affixation of the attachment component 212 to the substrate 214, the selected structure 216 such as the illustrative cable terminal having a bolt port 236 therein can be fitted over the threaded shank 220 and tightened thereon by means of a threaded nut 238. An underside surface of the cable terminal 216 is thus pressed firmly against the exposed upper end of the ground pin 218, thereby displacing the ground pin 218 downwardly within the passage 250 for pressing the sharp-pronged lower end through the elastomer plug 258 into conductive contact with the substrate 214, or a conductive mesh 260 or the like incorporated therein. Accordingly, the conductive ground pin 218 provides an effective ground path coupling the cable terminal 216 to the substrate 214.

Figure 14:
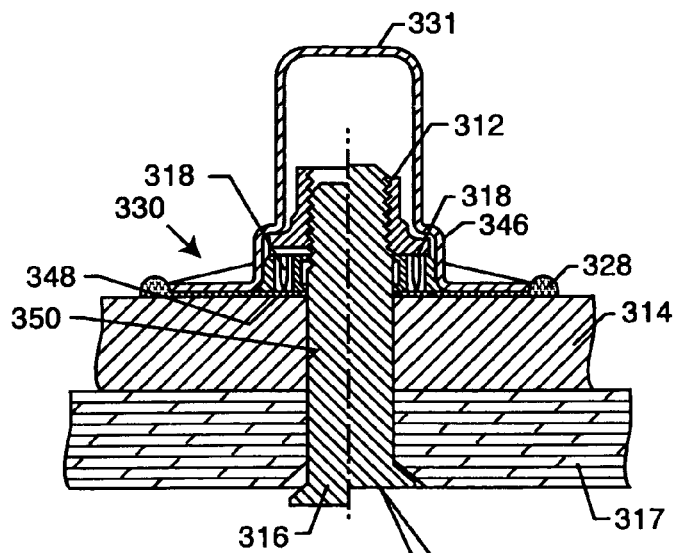
FIG. 14 is a fragmented sectional view similar to FIG. 13, but showing another alternative preferred form on the invention.

FIG. 14 illustrates a further alternative variation of the invention, wherein a modified attachment component 312 comprises a threaded nut or the like retained in position relative to a substrate 314 by means of a support fixture 330 adapted for adhesive bonded securement to the substrate by means of a bonding agent 328. The threaded nut 312 is adapted for connection to a selected structure 316 such as a threaded bolt passed through a bolt port 350 formed in the substrate 314. In this version as shown, the threaded bolt 316 comprises a headed metal bolt element used for mounting an associated structure 317 such as a nonconductive panel of the type formed from a carbon fiber-based composite material or the like used in aircraft construction. The threaded bolt 316 attaches the composite panel 317 to the substrate 314 comprising a conductive metal portion of an internal aircraft frame. In accordance with the invention, at least one conductive ground pin 318 is provided (two of which are shown in FIG. 14) for providing a ground path from the bolt 316 through the nut 312 to the substrate frame 314. In an aircraft application as described, the bolt 316 is thus grounded in the event of a lightning strike indicated by reference numeral 66.

More particularly, the support fixture 330 receives and supports the attachment component 312 such as the threaded nut, and is adapted for adhesive bonded attachment to the conductive substrate 314 as by means of a mounting fixture (not shown) of the type shown and described in U.S. Pat. Nos. 5,013,391 and 5,704,747, which are incorporated by reference herein. The support fixture 330 may incorporate a dome element 331 as shown. A washer-type collar 346 is slidably fitted into the support fixture 330 in substantially coaxial relation with the nut 312. The ground pin or pins 318 are constructed as previously shown and described herein with respect to FIGS. 6-13 to protrude from opposite ends of a collar passage or passages 348, although the pin or pins 318 may be constructed according to FIGS. 1-5 if desired. When the support fixture 330 is adhesively bonded onto the substrate 314, the lower ends of the ground pins 318 are initially retracted from the substrate, and preferably sealed as previously described against contact with the bonding agent used for mounting the support fixture 330. Subsequently, upon tightening of the threaded bolt 316, the nut 312 is drawn tightly against the collar 346 to displace the ground pin or pins 318 into conductive engagement between the nut 312 and the substrate 314 as previously shown and described herein.

Figure 15:
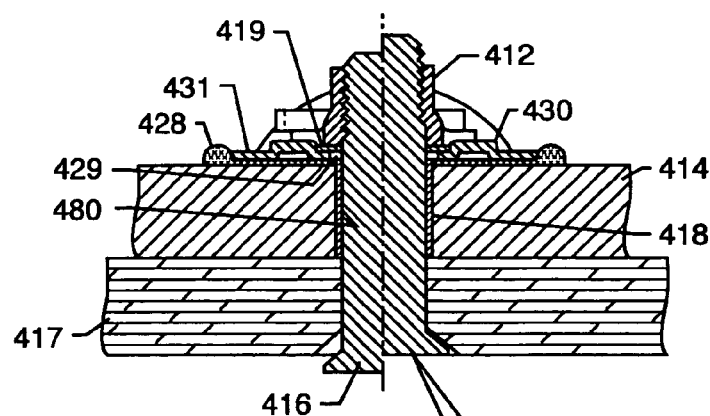
FIG. 15 is another fragmented sectional view similar to FIGS. 13 and 14, but showing yet another alternative preferred form of the invention.

FIG. 15 depicts a modified form of the embodiment shown and described in FIG. 14, wherein a modified ground pin 418 in the form of a conductive sleeve provides a conductive ground path. As shown, the attachment component 412 is again provided in the form of a threaded nut or the like carried by a support fixture 430 in the form of a nut retainer adapted for adhesive bonded affixation by means of a bonding agent 428 to a substrate 414 such as a metal frame in an aircraft or the like. A mounting fixture (not shown) of the type disclosed in the above-referenced U.S. Pat. 5,013,391 and 5,704,747 may be used for adhesively affixing the nut retainer 430 to the substrate 414. The conductive ground pin 418 such as a rolled steel sleeve or the like is press-fit mounted through a bolt port 429 formed in the nut retainer 430 and an aligned bolt port 480 formed in the substrate 414, and includes an upper flange 419 sandwiched axially between the nut 412 and a base plate 431 of the nut retainer 430.

When the support fixture 430 is adhesively bonded onto the substrate 414, the sleeve-shaped ground pin 418 protrudes axially into the bolt port 450 formed in the substrate 414, in relatively press-fit or tight-fit conductive engagement therewith. Subsequent installation of a threaded bolt 416, e.g., for mounting a composite panel 417 to the metal airframe substrate 414 is accompanied by electrical grounding of the bolt 416 through the nut 412 and ground pin sleeve 418 to the substrate 414. Accordingly, the bolt 416 exposed through the composite panel 417 is electrically grounded to the frame 414 in the event of a lightning strike indicated by reference numeral 66.

Although an embodiment has been described in detail for purposes of illustration, various modifications may be made without departing from the scope and spirit of the invention. Accordingly, no limitation on the invention is intended by way of the foregoing description and accompanying drawings, except as set forth in the appended claims.

What is claimed is:

1. An adhesive attachment, comprising:
   at least one component defining a surface for adhesive bonded attachment to a substrate;
   said at least one component including an attachment component for mounting a selected structure relative to said substrate; and
   a conductive pin for electrically coupling at least one of said attachment component and the selected structure mounted thereto to the substrate, upon mounting of the selected structure to said attachment component;
   said attachment component clamping said conductive pin between the substrate and one of said attachment component and the selected structure for pressing said conductive pin into conductive engagement with the substrate, upon mounting of the selected structure relative to said substrate.

2. The adhesive attachment of claim 1 wherein said at least one component comprises said attachment component.

3. The adhesive attachment of claim 2 wherein said attachment component defines a base surface for adhesive attachment to the substrate.

4. The adhesive attachment of claim 2 wherein said attachment component has an aperture formed therein, said conductive pin being slidably carried within said aperture.

5. The adhesive attachment of claim 4 further including means for initially retaining said conductive pin in a position retracted at least slightly from the substrate, upon adhesive attachment of said attachment component to the substrate, said conductive pin being advanced into conductive engagement with the substrate upon mounting of the selected structure thereto.

6. The adhesive attachment of claim 2 further including a conductive collar carried by said attachment component and having a counterbore formed therein opening in a direction toward the substrate, said conductive pin being carried within said counterbore, said collar being clamped between the selected structure and the substrate upon mounting of the selected structure onto said attachment component for advancing said conductive pin into conductive engagement with the substrate.

7. The adhesive attachment of claim 1 wherein said at least one component comprises a support fixture, said attachment component being carried by said support fixture.

8. The adhesive attachment of claim 7 further including means for initially retaining said conductive pin in a position retracted at least slightly from the substrate, upon adhesive attachment of said support fixture to the substrate, said conductive pin being advanced into conductive engagement with the substrate upon mounting of the selected structure to said attachment component.

9. The adhesive attachment of claim 1 wherein said conductive pin comprises a rolled steel pin.

10. The adhesive attachment of claim 1 wherein said conductive pin has at least one relatively sharp prong for engaging the substrate.

11. The adhesive attachment of claim 1 wherein said conductive pin has at least one relatively sharp prong at each of opposite ends thereof.

12. The adhesive attachment of claim 1 wherein said attachment component comprises a threaded element.

13. An adhesive attachment, comprising:
   an attachment component defining a base surface;
   an adhesive bonding agent for securely bonding said base surface of said attachment component to a conductive substrate;
   said attachment component including means for mounting a selected conductive structure relative to the substrate; and
   a conductive pin for electrically coupling the selected structure mounted to said attachment component to the substrate, upon mounting of the selected structure to said attachment component;
   said mounting means of said attachment component clamping said conductive pin between the substrate and one of said attachment component and the selected structure for pressing said conductive pin into conductive engagement with the substrate, upon mounting of the selected structure to said attachment component.

14. The adhesive attachment of claim 13 wherein said attachment component has an aperture formed therein, said conductive pin being slidably carried within said aperture.

15. The adhesive attachment of claim 14 further including means for initially retaining said conductive pin in a position retracted at least slightly from the substrate, upon adhesive attachment of said attachment component to the substrate, said conductive pin being advanced into conductive engagement with the substrate upon mounting of the selected structure thereto.

16. The adhesive attachment of claim 13 further including a conductive collar carried by said attachment component and having a counterbore formed therein opening in a direction toward the substrate, said conductive pin being carried within said counterbore, said collar being clamped between the selected structure and the substrate upon mounting of the selected structure onto said attachment component for advancing said conductive pin into conductive engagement with the substrate.

17. An adhesive attachment, comprising:
   an attachment component;
   a support fixture carrying said attachment component and defining a base surface;
   an adhesive bonding agent for securely bonding said base surface of said support fixture to a conductive substrate;
   said attachment component including means for mounting a conductive structure relative to the substrate; and
   a conductive pin for electrically coupling the structure mounted to said attachment component to the substrate, upon mounting of the selected structure to said attachment component;
   said mounting means of said attachment component clamping said conductive pin between the substrate and one of said attachment component and the selected structure for pressing said conductive pin into conductive engagement with the substrate, upon mounting of the selected structure to said attachment component.

18. The adhesive attachment of claim 17 further including means for initially retaining said conductive pin in a position retracted at least slightly from the substrate, upon adhesive attachment of said support fixture to the substrate, said conductive pin being advanced into conductive engagement with the substrate upon mounting of the selected structure to said attachment component.

19. A method of mounting a conductive structure relative to a conductive substrate in electrically coupled relation therewith, comprising the steps of:
   forming an adhesive attachment defining a base surface and including means for mounting the conductive structure thereto;
   mounting a conductive pin on the adhesive attachment in an initial position retracted at least slightly from the base surface;
   adhesively bonding the base surface to the conductive substrate; and
   thereafter mounting the conductive structure to the adhesive attachment, said conductive structure mounting step pressing the conductive pin into electrically coupled relation with the conductive substrate.

20. The method of claim 19 wherein said means for mounting the conductive structure to the adhesive attachment comprises a threaded element.

21. An adhesive attachment, comprising:
   at least one component defining a surface for adhesive bonded attachment to a substrate;
   said at least one component including an attachment component for mounting a selected structure relative to said substrate; and
   an elongated conductive sleeve for electrically coupling at least one of said attachment component and the selected structure mounted thereto to the substrate, upon mounting of the selected structure to said attachment component;
   said attachment component pressing said conductive sleeve mechanically into conductive engagement with the substrate, upon mounting of the selected structure relative to said substrate.

* * * * *